(12) United States Patent
Komatsu

(10) Patent No.: US 7,299,566 B2
(45) Date of Patent: Nov. 27, 2007

(54) SUBSTRATE-PLACING MECHANISM HAVING SUBSTRATE-HEATING FUNCTION

(75) Inventor: Tomohito Komatsu, Nirasaki (JP)

(73) Assignee: Tokyo Electron Limited, Tokyo-To (JP)

( * ) Notice: Subject to any disclaimer, the term of this patent is extended or adjusted under 35 U.S.C. 154(b) by 0 days.

(21) Appl. No.: 11/367,391

(22) Filed: Mar. 6, 2006

(65) Prior Publication Data

US 2006/0207120 A1   Sep. 21, 2006

(30) Foreign Application Priority Data

Mar. 16, 2005   (JP)   ............................. 2005-074713

(51) Int. Cl.
*F26B 21/06*   (2006.01)
(52) U.S. Cl. .......................................... 34/78; 324/765
(58) Field of Classification Search .................... 34/78, 34/79, 80; 324/765
See application file for complete search history.

(56) References Cited

U.S. PATENT DOCUMENTS 5,557,215 A * 9/1996 Saeki et al. ................. 324/765
5,625,526 A * 4/1997 Watanabe et al. ........... 361/234
6,047,660 A * 4/2000 Lee ....................... 118/723 VE

FOREIGN PATENT DOCUMENTS

JP   2001-160479   6/2001

* cited by examiner

*Primary Examiner*—S. Gravini
(74) *Attorney, Agent, or Firm*—Smith, Gambrell & Russell, LLP

(57) ABSTRACT

The present invention is a substrate-placing mechanism to be provided in a processing container of a substrate-processing apparatus including: a stage having: a base body on which a substrate is placed, a heat-generating body for heating the substrate placed on the base body, and a feed terminal part for feeding electric power to the heat-generating body; a hollow supporting part fixed to a base of the processing container for supporting the stage; a connection terminal part fixed to the base of the processing container under the supporting part for being connected to an electric power source located outside the processing container; a feed member connected to the feed terminal part and extending in the hollow supporting part; and a spring member that connects the feed member and the connection terminal part.

8 Claims, 6 Drawing Sheets

SUBSTRATE-PLACING MECHANISM HAVING SUBSTRATE-HEATING FUNCTION

FIELD OF THE INVENTION

This invention relates to a substrate-placing mechanism having a substrate-heating function, which heats a substrate such as a semiconductor wafer placed thereon in a processing container, and to a substrate-processing apparatus including the substrate-placing mechanism.

BACKGROUND ART

In order to manufacture a desired semiconductor device, various vacuum processes including a CVD film-forming process and/or a plasma etching process are carried out to a substrate to be processed, for example a semiconductor wafer. In such a process, the semiconductor wafer has to be heated to a predetermined temperature. Thus, a heater is used to heat a substrate-supporting member.

As such a heater, a stainless-steel heater or the like is used conventionally. However, recently, a ceramic heater has been spread because it has high corrosion resistance against a halogen gas used in the process and high thermal efficiency. The ceramic heater has a base body serving as a stage for placing a substrate to be processed thereon and a heat-generating body buried in the base body. The base body may be made of a dense sintered ceramic such as AIN. The heat-generating body may be made of high-melting-point metal.

A substrate-processing apparatus including the ceramic heater as a substrate-placing stage is disclosed in JP Laid-Open Publication No. 2001-160479 (Patent Document 1). In the substrate-processing apparatus disclosed in the Patent Document 1, a ceramic heater serving as a substrate-placing stage is supported by a supporting body that stands up at a base of a processing container. In the supporting body, a feeder line for feeding electric power to the heat-generating body of the ceramic heater is provided. The feeder line is connected to feed terminals for the heat-generating body, which are arranged on a lower surface of the ceramic heater. Thus, the heat-generating heater is fed the electric power from the outside electric power supply source through the feeder line and the feed terminals.

As the feeder line, a rod-like feeder line, i.e., a feed rod is used. In general, the feed rod is made of a nickel alloy or the like, and has high heat resistance. The feed rod and the feed terminals are connected by a mesh wire. At a lower-end portion of the supporting body, the feed rod is fixed to connection terminals for being connected to the power supply source, for example by means of screws.

Herein, recently, the size of the semiconductor wafer has been shifted from 200 mm to 300 mm, and thereby the size of the substrate-processing apparatus has been also increased. If the size of the substrate-processing apparatus is large, it is impossible to ignore thermal expansion of the feed rod when the semiconductor wafer is heated by the ceramic heater. That is, breaking or the like at a feed member such as a feed wire may be caused by repetition of heating.

SUMMARY OF THE INVENTION

This invention is intended to solve the above problems. The object of this invention is to provide a substrate-placing mechanism having a substrate-heating function, wherein breaking or the like is unlikely to be caused at a feed member, and a substrate-processing apparatus including the substrate-placing mechanism.

The invention proposed to achieve the above object is a substrate-placing mechanism to be provided in a processing container of a substrate-processing apparatus comprising: a stage having: a base body on which a substrate is placed, a heat-generating body for heating the substrate placed on the base body, and a feed terminal part for feeding electric power to the heat-generating body; a hollow supporting part fixed to a base of the processing container for supporting the stage; a connection terminal part fixed to the base of the processing container under the supporting part for being connected to an electric power source located outside the processing container; a feed member connected to the feed terminal part and extending in the hollow supporting part; and a spring member that connects the feed member and the connection terminal part.

According to the above feature, since the spring member is provided between the feed member and the connection terminal part, when the feed member thermally expands, compression of the spring member can absorb effect of the thermal expansion. That is, even if the feed member thermally expands because of a temperature increase, breaking or the like at the feed member can be prevented.

It is preferable that the spring member connects the feed member and the connection terminal part in such a manner that the feed member keeps being subjected to a tensile force even when the feed member thermally expands during a heat generation of the heat-generating body.

In the case, it is prevented that the feed member is subjected to a complex stress consisting of tensile and compressive forces. Thus, it is possible to much effectively prevent the breakage or the like of the feed member.

In the case, for example, the spring member connects the feed member and the connection terminal part at a room temperature under a condition wherein the spring member is extended by a distance larger than a maximum length of thermal expansion of the feed member during the heat generation of the heat-generating body.

In addition, for example, the feed member comprises a feed rod and a feed wire of a braided structure. In addition, for example, the spring member is a plate spring. Herein, it is preferable that the plate spring mainly consists of one or more horizontal-plane parts and one or more vertical-plane parts. In such a case, it is easy to design a plate spring having an increased transverse rigidity. The plate spring having an increased transverse rigidity doesn't resonate when some vibration is generated. That is, the plate spring having an increased horizontal rigidity doesn't have any bad effect on the feed member.

In addition, for example, the base body of the stage is made of a ceramic, and the heat-generating body of the stage is buried in the base body.

In addition, the present invention is a substrate-processing apparatus comprising: a processing container in which a reduced pressure can be maintained; a substrate-placing mechanism having any of the above features provided in the processing container; and a processing mechanism that conducts a predetermined process to a substrate placed on the substrate-placing mechanism.

DESCRIPTION OF THE PREFERRED EMBODIMENT

Hereinafter, embodiments of the present invention are explained in detail with reference to the attached drawings. Herein, a CVD film-forming apparatus including a substrate-placing mechanism according to the present invention is explained.

Figure 1:
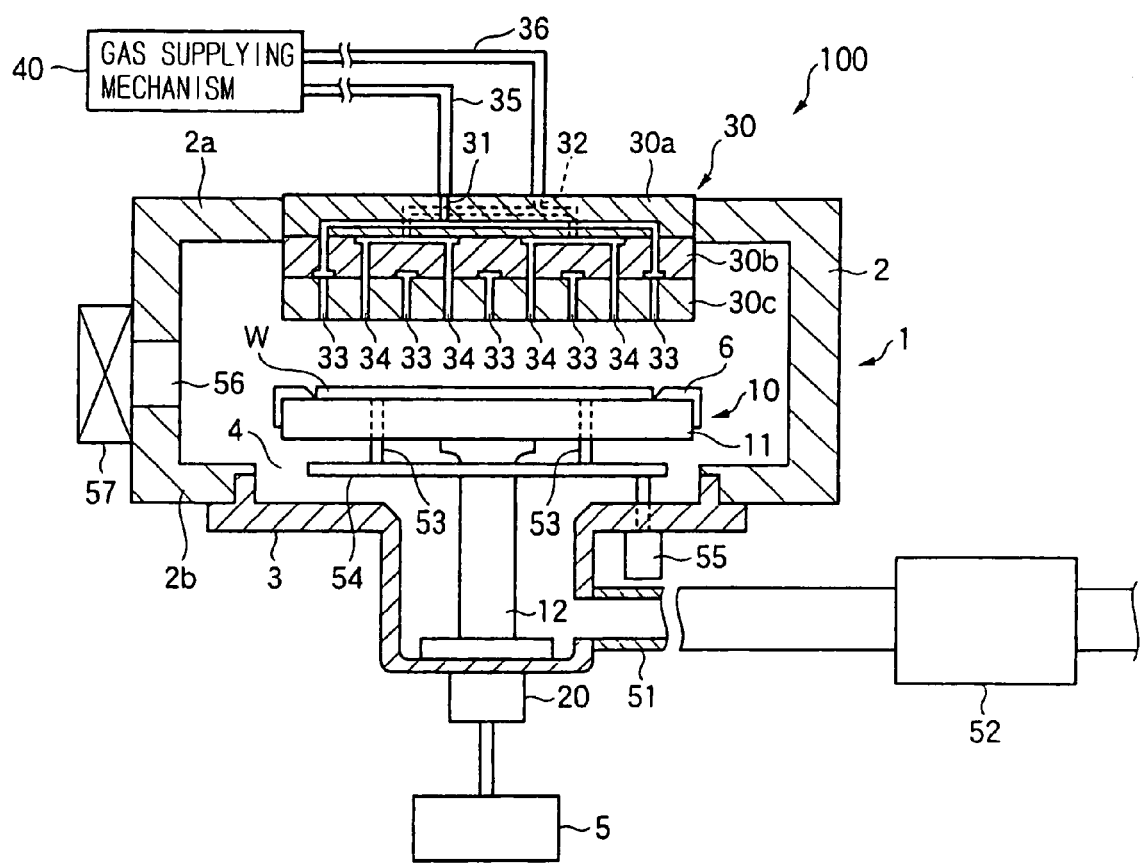
FIG. 1 is a schematic sectional view showing a CVD film-forming apparatus including a wafer-placing mechanism according to a first embodiment of the present invention.

FIG. 1 is a schematic sectional view showing a CVD film-forming apparatus including a wafer-placing mechanism according to a first embodiment of the present invention. The CVD film-forming apparatus 100 has a processing container 1. The processing container 1 has a hermetically sealed chamber 2 of a substantially cylindrical shape, and a gas-discharging chamber 3 protruded downwardly from a bottom wall 2b of the chamber 2. In the chamber 2, a wafer-placing mechanism 10 for placing thereon a semiconductor wafer W, as an object to be processed, in a horizontal position is provided. The wafer-placing mechanism 10 has a wafer-placing stage 11 having a wafer-placing surface, and a cylindrical supporting member 12 that stands up at a base portion of the processing container 1 and supports a central portion of the wafer-placing stage 11. In addition, as described below, the wafer-placing mechanism 10 has a heat-generating body buried in the wafer-placing stage 11, and a feed mechanism for feeding electric power to the heat-generating body from an outside electric power source 5. A guide ring 6 for guiding the wafer W is provided at an outside peripheral portion of the wafer-placing stage 11.

A showerhead 30 is provided at a ceiling wall 2a of the chamber 2. The showerhead 30 consists of an upper block 30a, a middle block 30b and a lower block 30c. A first gas-introducing port 31 and a second gas-introducing port 32 are formed at an upper surface of the upper block 30a. A plurality of first gas-ejecting holes 33 and a plurality of second gas-ejecting holes 34 are alternately formed in the lower block 30c.

A gas-supplying pipe 35 extending from a gas-supplying mechanism 40 is connected to the first gas-introducing port 31. Thus, a $TiCl_4$ gas, for example, is introduced from the gas-supplying mechanism 40 into the showerhead 30 through the gas-supplying pipe 35 and the first gas-introducing port 31. In the showerhead 30, the $TiCl_4$ gas flows in gas passages formed in the respective blocks 30a, 30b and 30c. Then, the $TiCl_4$ gas is ejected from the gas-ejecting holes 33. On the other hand, a gas-supplying pipe 36 extending from the gas-supplying mechanism 40 is connected to the second gas-introducing port 32. Thus, an $NH_3$ gas, for example, is introduced from the gas-supplying mechanism 40 into the showerhead 30 through the gas-supplying pipe 36 and the second gas-introducing port 32. In the showerhead 30, the $NH_3$ gas flows in gas passages formed in the respective blocks 30a, 30b and 30c. Then, the $NH_3$ gas is ejected from the gas-ejecting holes 34. That is, the gas introduced from the first gas-introducing port 31 and the gas introduced from the second gas-introducing port 32 are not mixed in the showerhead 30, but mixed after they are separately ejected from the first gas-ejecting holes 33 and the second gas-ejecting holes 34 (Post-Mix Type).

The gas-discharging chamber 3 is provided below a central portion of the bottom wall 2b of the chamber 2 so as to cover a circular hole 4 formed at the central portion of the bottom wall 2b of the chamber 2. A gas-discharging pipe 51 is connected to a side wall of the gas-discharging chamber 3. A gas-discharging apparatus 52 is connected to the gas-discharging pipe 51. Thus, by means of an operation of the gas-discharging apparatus 52, the pressure in the processing container 1 can be reduced to a predetermined vacuum level.

Three (only two are shown) wafer-supporting pins 53 for supporting the wafer W and moving the same up and down are provided in the wafer-placing stage 11 in such a manner that the three wafer-supporting pins 53 can protrude up and sink down with respect to a surface of the wafer-placing stage 11. These wafer-supporting pins 53 are fixed to a supporting plate 54. The wafer-supporting pins 53 are moved up and down by a driving mechanism 55 such as an air cylinder or the like, via the supporting plate 54.

A side wall of the chamber 2 is provided with a transfer port 56 through which the wafer W is conveyed from and into a conveyance chamber maintained in a vacuum state and not shown. A gate valve 57 is provided for opening and closing the transfer port 56.

Figure 2:
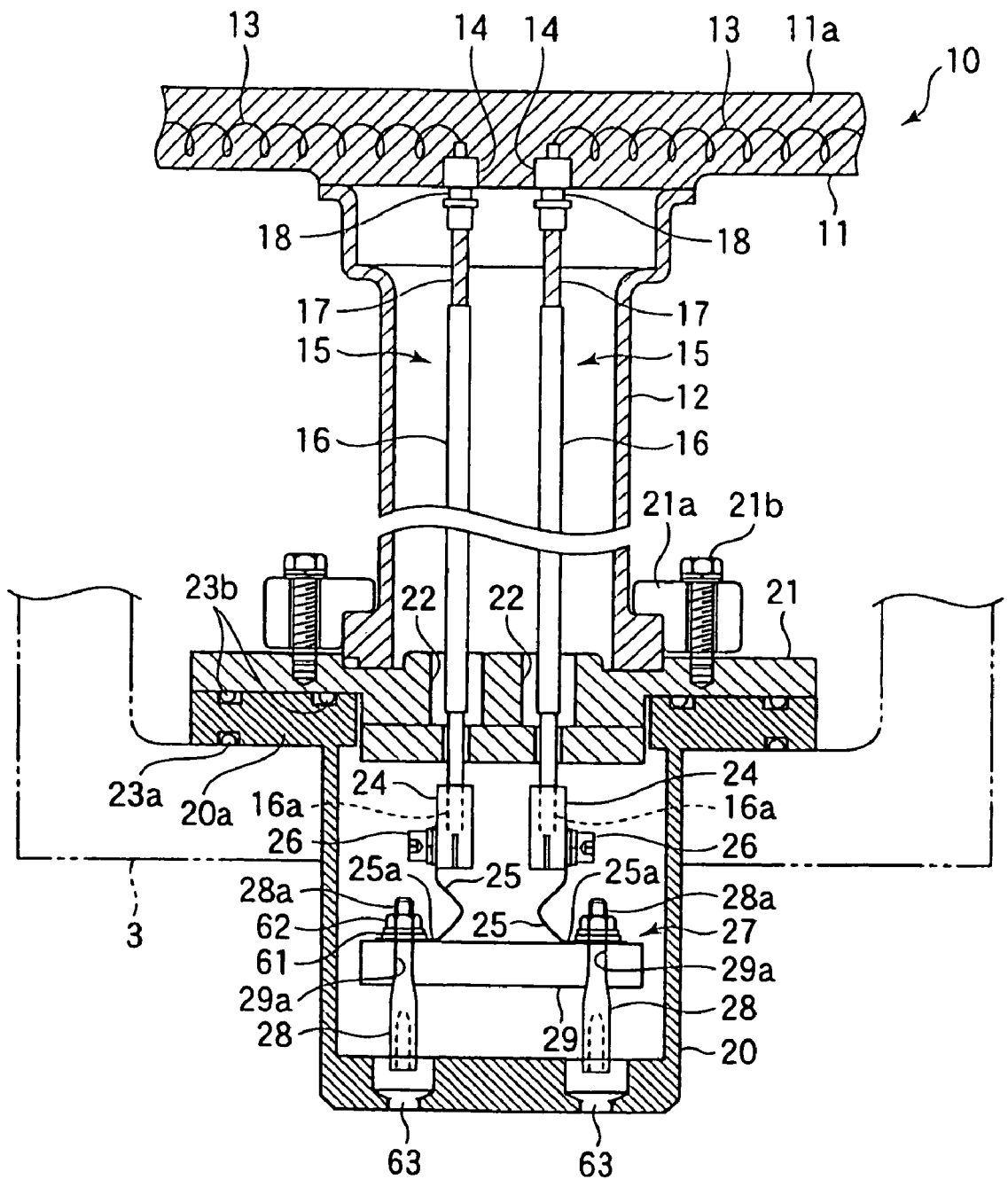
FIG. 2 is an enlarged sectional view showing the wafer-placing mechanism according to the first embodiment of the present invention.

Then, the wafer-placing mechanism 10 is explained in detail with reference to the enlarged sectional view of FIG. 2.

As described above, the wafer-placing mechanism 10 has the wafer-placing stage 11 and the cylindrical supporting member 12 that supports the wafer-placing stage 11. The wafer-placing stage 11 is formed as a ceramic heater. Concretely, the wafer-placing stage 11 has a base body 11a made of a ceramic material and a heat-generating body 13 buried in the base body 11a. The ceramic material may be AlN, $Al_2O_3$, or the like. The heat-generating body 13 may be made of high-melting-point metal such as tungsten. The heat-generating body 13 is divided into two zones (for example, a central zone and a peripheral zone). Each element of the heat-generating body 13 corresponding to each zone is connected to two (positive and negative) feed terminal parts 14 at a central portion of the wafer-placing stage 11. (In FIG. 2, for the purpose of clear illustration, only one feed terminal part 14 is shown for each element of the heat-generating body 13 corresponding to each zone.)

Each feed terminal part 14 is connected to a feed member 15 extending in the supporting member 12. A lower end of the supporting member 12 is connected to a connection chamber 20 mounted protrudently under the gas-discharging chamber 3, via a bottom lid 21 as described below. The lower end of the feed member 15 extends to the inside of the connection chamber 20. The feed member 15 is made of a heat-resistance metal such as a Ni alloy, and comprises: a feed rod 16 extending from a vicinity of the upper end of the supporting member 12 to the inside of the connection chamber 20; a terminal 18 for being connected to the feed terminal part 14; and a feed wire 17 consisting of a braided conductor and connecting the feed rod 16 and the terminal 18.

A bottom lid 21 having a flange and consisting of an insulation material is mounted on a bottom part of the supporting member 12 by means of mounting members 21a and screws 21b. The bottom lid 21 has vertical holes 22, through which the feed rods 16 are inserted.

The connection chamber 20 is also cylindrical. The upper end of the connection chamber 20 has a flange 20a. The flange 20a is clamped between the bottom lid 21 and a bottom wall of the gas-discharging chamber 3. A circular (ring) sealing member 23a is provided between the flange 20a and the bottom wall of the gas-discharging chamber 3 in order to hermetically seal therebetween. In addition, two (double) circular sealing members 23b are provided between the flange 20a and the bottom lid 21 in order to hermetically seal therebetween.

A plate spring 25 is mounted to a lower end of each feed rod 16 via a clamping member 24. In detail, a threaded portion 16a is formed at the lower end of each feed rod 16, the threaded portion 16a and the clamping member 24 are threadedly engaged with each other, and the plate spring 25 is fixed on the claming member 24 by means of a screw 26. A mounting portion 25a of each plate spring 25 on a lower-end side thereof is connected to a connection terminal unit 27 fixedly provided in the connection chamber 20. The connection terminal unit 27 has a plurality of connection terminals 28 mounted for the respective plate springs 25, and a plate-like positioning member 29 that positions the plurality of connection terminals 28. Each plate spring 25 is connected (fixed) to each connection terminal 28 as follows. That is, a threaded portion 28a of an upper-end portion of the connection terminal 28 is inserted through a vertical hole 29a formed at the positioning member 29 from a lower side of the vertical hole 29a; and then is inserted through a hole formed at the mounting portion 25a of the plate spring 25 from a lower side of the hole; and then is threadedly engaged with a nut 62 via a washer 61.

Correspondingly to each connection terminal 28, a hole 63 is formed at the base portion of the connection chamber 20. Through each hole 63, a feed line from the electric power source 5 is connected to each connection terminal 28.

Then, an operation of the film-forming apparatus 100 as structured above is explained.

At first, the heat-generating body 13 buried in the wafer-placing stage 11 is fed the electric power from the electric power supplying source 5. Thus, the wafer-placing stage 11 is heated to, for example, about 500° C. to 700° C. On the other hand, the pressure in the processing container 1 is fully reduced (to create a vacuum) by the gas-discharging apparatus 52, and then the gate valve 57 is opened, and the wafer W is conveyed into the chamber 2 from the conveyance chamber in a vacuum state through the transfer port 56. The wafer W is placed on the upper surface of the wafer-placing stage 11. Then, the gate valve 57 is closed. Under such a state, from the gas-supplying mechanism 40, through the gas-supplying pipes 35 and 36, the $TiCl_4$ gas and the $NH_3$ gas are separately supplied into the showerhead 30 at respective predetermined flow rates. The $TiCl_4$ gas and the $NH_3$ gas are supplied from the showerhead 30 into the chamber 2, separately from each other. Thus, on or above the upper surface of the wafer W placed on the wafer-placing stage 11, the $TiCl_4$ gas and the $NH_3$ gas react on each other, so that a TiN film is deposited on the wafer W by a thermal CVD.

During the film-deposition process, the temperature in the processing container 1 is increased, so that the temperature of the feed member 15 of the wafer-placing mechanism 10 is also increased to about 500° C. or more. Thus, compared with a state at a room temperature before the film-deposition process, the length of the feed member 15 is lengthened by thermal expansion thereof. For example, in a film-forming apparatus for a 300 mm wafer, the length of a feed rod 16, which takes the majority of a feed member 15, is about 250 mm at a room temperature. However, when the temperature of the feed rod 16 is increased to, for example, 675° C., the feed rod 16 thermally expands in a longitudinal direction thereof by no less than 1.4 mm.

Figure 3A:
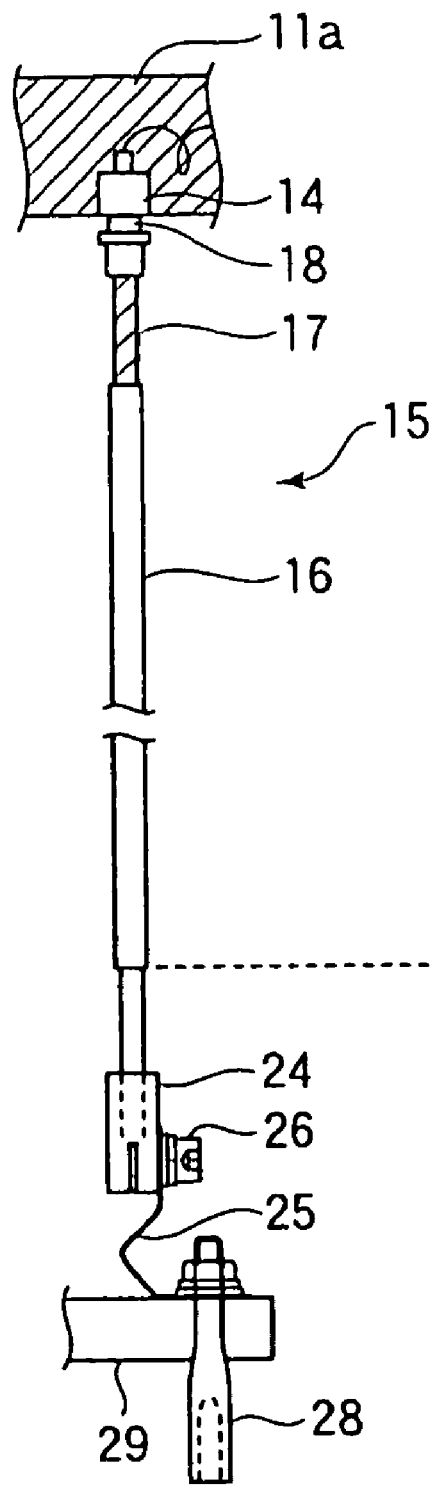
FIG. 3A is a schematic view showing a plate spring in the wafer-placing mechanism according to the first embodiment of the present invention, at a normal (room) temperature.
Figure 3B:
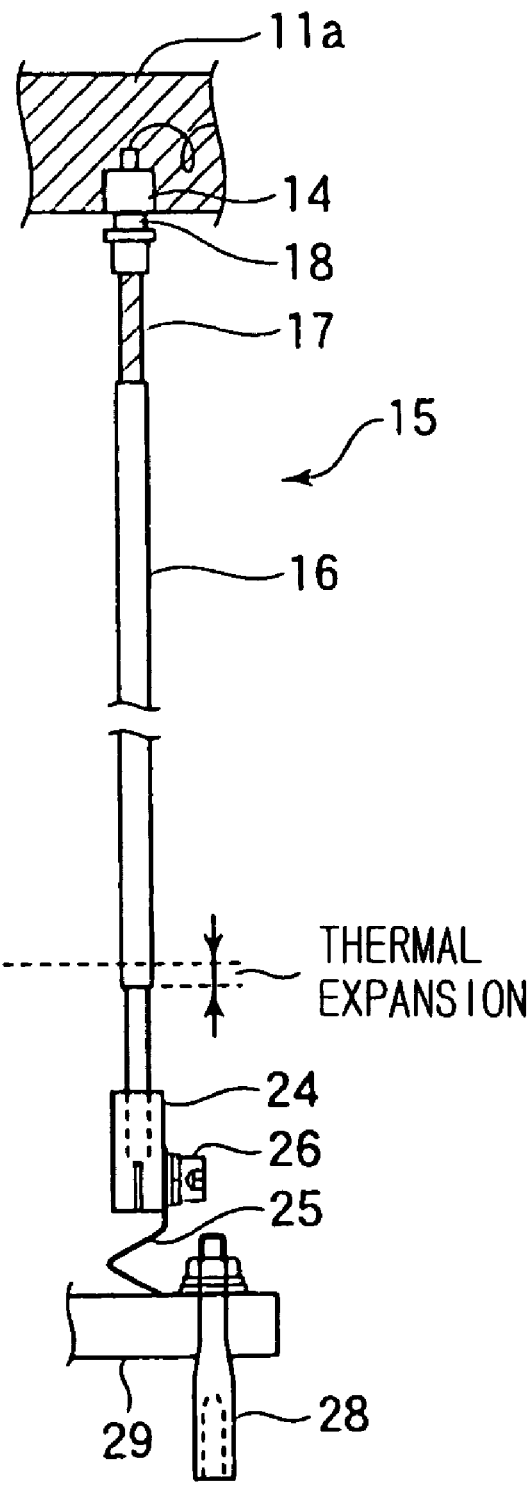
FIG. 3B is a schematic view showing the plate spring in the wafer-placing mechanism according to the first embodiment of the present invention, at a high temperature.

Then, in the present embodiment, the plate springs 25 are provided between the feed members 15 and the connection terminal unit 27. In the case, when each feed member 15 thermally expands, each corresponding plate spring 25 is compressed from a normal state thereof at a room temperature as shown in FIG. 3A, to a compressed state thereof as shown in FIG. 3B. Thus, almost the whole thermal expansion of the feed members 15 can be absorbed by the plate springs 25. Therefore, even if the feed members 15 thermally expand because of a temperature increase, there is remarkably less possibility that breakage or the like is caused at the feed members 15.

Next, a wafer-placing mechanism according to a second embodiment of the present invention is explained.

In the above first embodiment, the thermal expansion of the feed rods 16, which take the majority of the feed members 15, can be mainly absorbed by the plate springs 25. However, when the whole thermal expansion is not absorbed by the plate springs 25, a redundant part of the thermal expansion is absorbed by bending of the feed wires 17 consisting of the braided conductors. In the case, each feed wire 17 that has been subjected to a tensile force by a weight of each corresponding feed rod 16 at a room temperature is subjected to a compressive force by thermal expansion of the feed rod 16, so that a buckling may be caused at the feed wire 17. When such a heating process is repeated, the buckling may be caused at the feed wire 17 repeatedly. Then, a complex stress is caused in the feed wire 17, and the periphery is at a high temperature, so that a creep is likely to be generated at the feed wire 17. Then, there is possibility that breakage or the like is caused by the creep at the feed wire 17.

Then, as the second embodiment, a wafer-placing mechanism that can prevent a buckling of the feed wire 17 as much as possible is explained.

Figure 4:
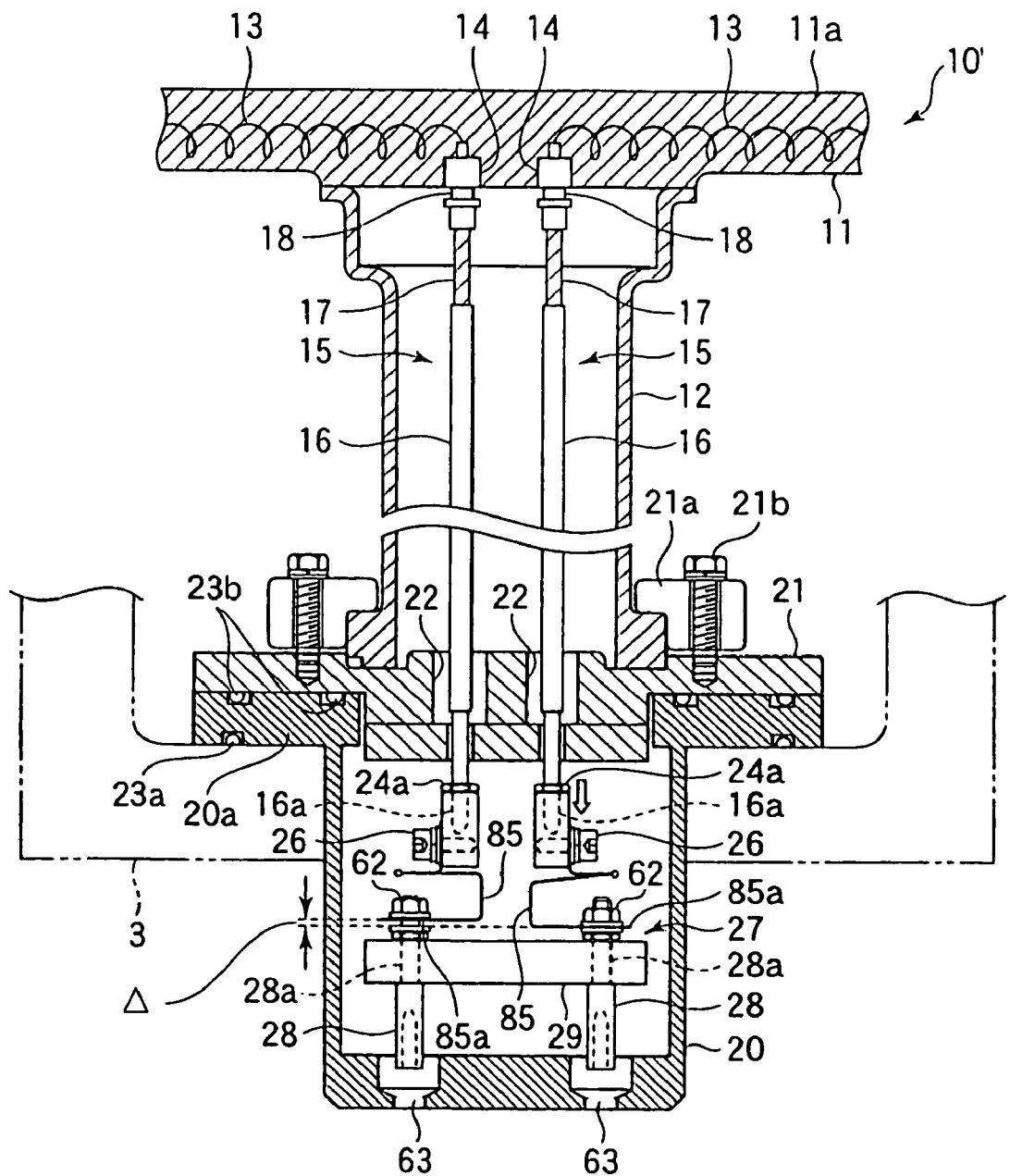
FIG. 4 is an enlarged sectional view showing a wafer-placing mechanism according to a second embodiment of the present invention.

FIG. 4 is an enlarged sectional view showing the wafer-placing mechanism according to the second embodiment of the present invention. The wafer-placing mechanism 10' is used for the film-forming apparatus as shown in FIG. 1, in the same manner as the first embodiment. The basic structure of the wafer-placing mechanism 10' is substantially the same as that of the wafer-placing mechanism 10 shown in FIG. 2. Thus, the same elements and portions as the wafer-placing mechanism 10 are represented by the same reference numerals, and their explanation is omitted.

In the wafer-placing mechanism 10', each plate spring 85 is mounted at a lower end of each feed rod 16, instead of the plate spring 25 of the first embodiment. The structure of the plate spring 85 is different from that of the plate spring 25 (see FIG. 5). Herein, when the plate spring 85 is mounted at a room temperature, as shown in a left-hand portion of FIG. 4, a lower-end position of the plate spring 85 at a normal state thereof before fixed is adjusted higher than a lower-end position of the plate spring 85 after fixed by a distance Δ.

The distance Δ is longer than a maximum length of the thermal expansion of the feed rod 16 during the film-forming process. For the purpose of this adjustment, a nut 24a is threadedly engaged with the threaded portion 16a. Then, after the adjustment, as shown in a right-hand portion of FIG. 4, the plate spring 85 is stretched downward and fixed to the connection terminal 28 by means of the nut 62. For example, as described above, the feed rod 16 thermally expands by about 1.4 mm by a heating process to 700° C. Thus, the distance Δ is, for example, about 2 mm.

Thus, at the room temperature, a biasing force of the plate spring 85 acts downwardly. This acts as a tensile force for the feed member 15. Then, during the film-forming process (at a high temperature), even if the feed rod 16 thermally expands, since the plate spring 85 is mounted with stretched by the distance Δ longer than the maximum thermal expansion length, the feed member 15 keeps being subjected to a tensile force, as a whole. Thus, the feed wire 17 also keeps being subjected to a tensile force. Thus, no (repeated) buckling may be caused at the feed wire 17 by the thermal expansion of the feed rod 16. Thus, according to the second embodiment, it can be much effectively prevented that breaking or the like of the feed wire 17 is caused by a creep or the like that may be caused by a buckling because of the thermal expansion.

In addition, it is possible to design the plate spring 85 in such a manner that the plate spring 85 has a low rigidity in a stretching direction. For example, it is possible to set the maximum tensile load at a room temperature to about 1.0 kgf. The tensile load (force) is much smaller than a tensile strength of the feed wire 17 consisting of the braided conductor and a tensile strength of a connecting part of the feed terminal part 14. Thus, the tensile load (force) is ignorable. Thus, the possibility that the feed wire 17 and the connecting portion of the feed terminal part 14 are broken by the above tensile load at the room temperature is very low. In addition, at a high temperature, the strength of the feed wire 17 is reduced, but the tensile force by the plate spring 85 is also reduced by the thermal expansion of the feed rod 16. Thus, no problem arises.

The temperature of the feed wire 17 when the wafer-placing stage 11 is at the highest temperature of 700° C. is thought to be 675° C. through the result of a simulation. Thus, at the temperature of 675° C., a creep lifetime by the above tensile force was measured. As a result, it was found that the creep lifetime exceeds 100 thousands hours even when a test peace is always subjected to a tensile load of 10 kgf, which is ten times as large as the above tensile load of the plate spring 85, at a safety ratio of 10. That is, it was confirmed that the plate spring 85 has no problem regarding creep resistance.

Figure 5:
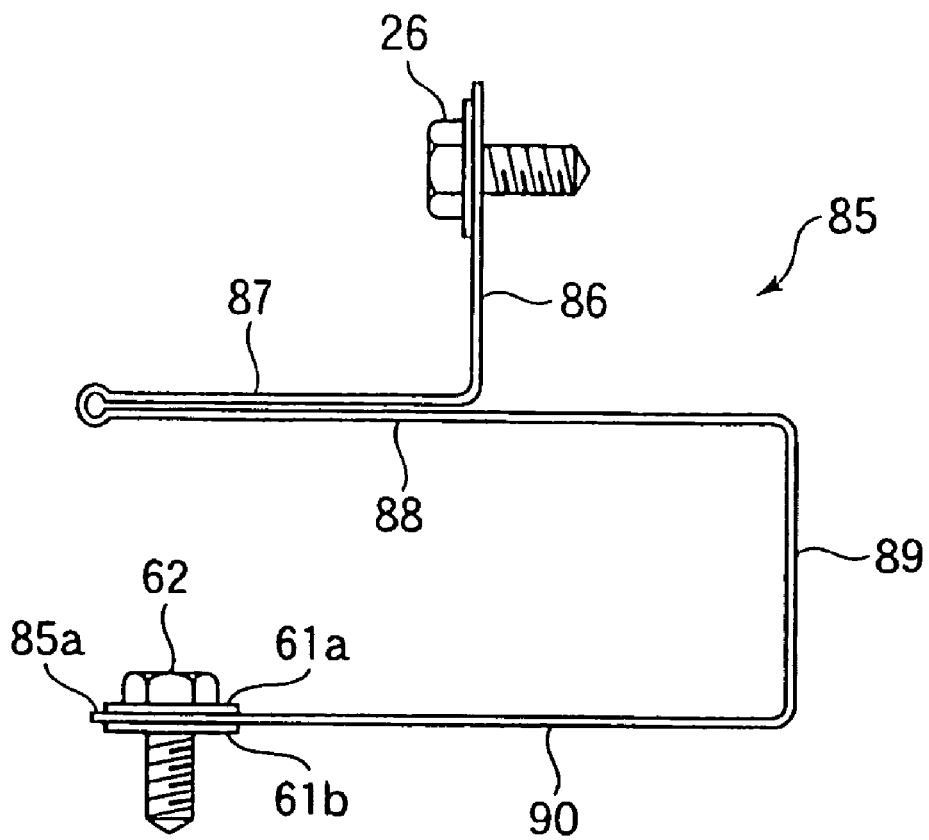
FIG. 5 is an enlarged side view showing a plate spring in the wafer-placing mechanism according to the second embodiment of the present invention.
Figure 6:
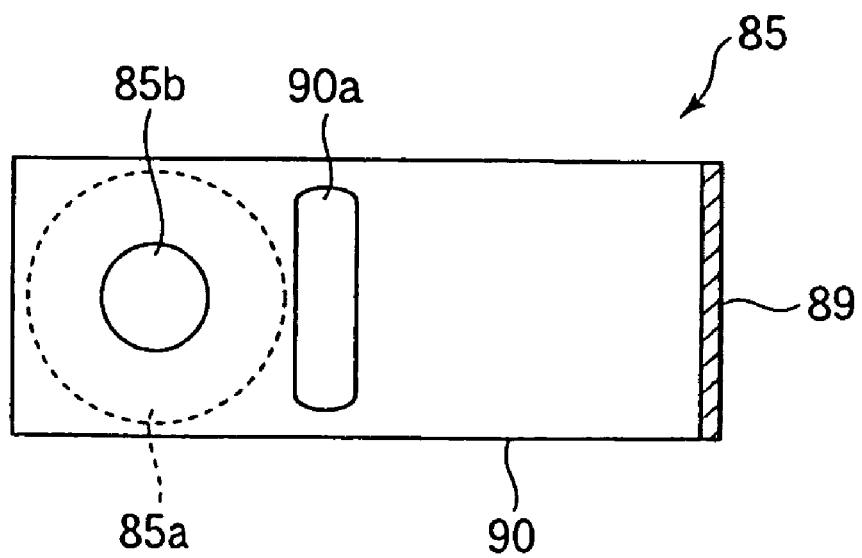
FIG. 6 is a plan view showing a third horizontal plane of the plate spring in the wafer-placing mechanism according to the second embodiment of the present invention.

It is thought that a buckling of the feed wire 17 is unlikely to be caused if a plate spring having a low rigidity in a stretching direction and a large rigidity in lateral (transverse) and torsional directions is adopted. As shown in FIG. 5, the plate spring 85 used in the present embodiment essentially consists of: a first vertical part 86 having a mounting portion for the feed rod 16; a first horizontal part 87 extending horizontally after bent at the lower end of the first vertical part 86 by 90°; a second horizontal part 88 extending horizontally after bent at the tip end of the first horizontal part 87 by 180° and exceeding the lower end of the first vertical part 86; a second vertical part 89 extending downward after bent at the tip end of the second horizontal part 88 by 90°; and a third horizontal part 90 extending horizontally after bent at the lower end of the second vertical part 89 by 90° and being opposite to the second horizontal part 88. A mounting portion 85a is provided in the third horizontal part 90; That is, the plate spring 85 substantially consists of the vertical-plane parts 86, 89 and the horizontal-plane parts 87, 88, 90. If a horizontal-plane part is large, since the horizontal-plane part serves as a plate spring, rigidity in a stretching direction is low. If a vertical-plane part is large, since the vertical-plane part serves as resistance against deformation in lateral and torsional directions, rigidity in the lateral and torsional directions is large. In addition, as shown in FIG. 6, if an oblong hole 90a extending in a width direction of the third horizontal part 90 is formed at the third horizontal part 90 in the vicinity of the mounting portion 85a, the rigidity in the stretching direction can be reduced more.

Figure 7A:
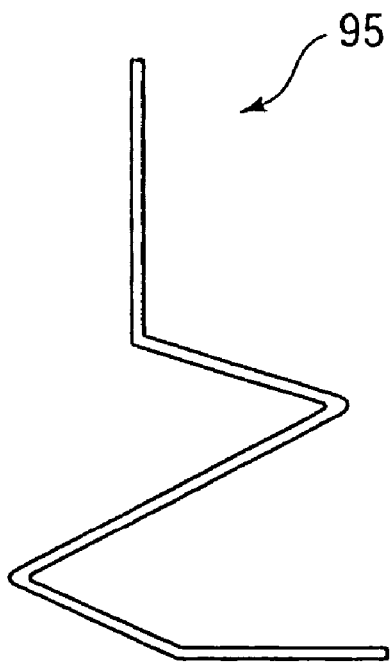
FIG. 7A and 7B are side views showing two types of plate springs for comparison.
Figure 7B:
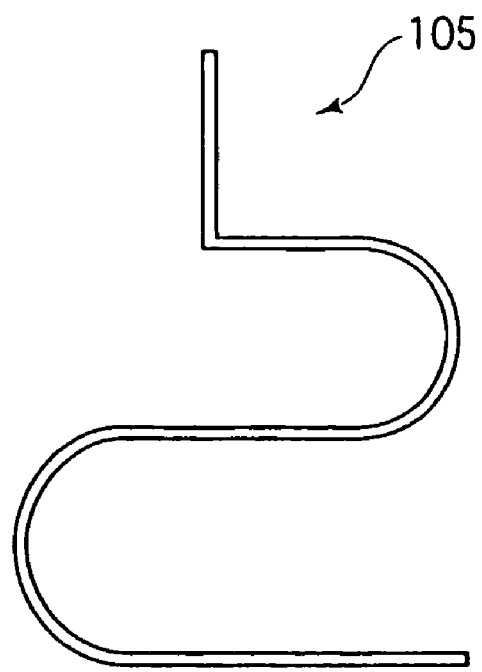

The rigidity in the lateral direction of the above plate spring 85 is so large that the plate spring 85 doesn't resonate in a vibration test. On the other hand, when a spring surface is diagonal like the plate spring 25 used in the first embodiment and the plate spring 95 shown in FIG. 7A, and when a spring surface has a curved plane like the plate spring 105 shown in FIG. 7B, the rigidity in the lateral direction is so small that the plate springs resonate in a vibration test. That is, in the latter cases, the feed wire 17 may be subjected to a complex stress. That is, the plate spring 85 is stronger than the other plate springs, regarding vibration. That is, the shape of the plate spring 85 is more effective against a buckling of the feed wire 17.

In addition, in the present embodiment, two washers 61a, 61b are mounted on and under the mounting portion 85a of the plate spring 85 for fixing the plate spring 85 to the connection terminal 28 (Double Washer). Thus, the plate spring 85 can be fixed to the connection terminal 28 more strongly, and the plate spring 85 can have better anti-vibration characteristics.

Of course, the plate spring 85 of the present embodiment can be applied to the first embodiment. In the case too, the possibility of a buckling of the feed wire 17 can be reduced.

The present invention is not limited to the above embodiments, but may be variously modified. For example, in the above embodiments, the plate springs are used. However, a coil spring or any other spring may be used. In addition, in the above embodiments, the feed member has the feed wire provided at the top end of the feed rod. However, the feed member is not limited thereto.

In addition, in the above embodiments, the substrate-placing mechanism of the present invention is applied in the CVD film-forming apparatus. However, the substrate-processing apparatus is not limited thereto, as far as it heats a substrate and conducts a process to the substrate. In addition, instead of the semiconductor wafer, the present invention can be applied to any other substrate, for example a flat panel display substrate such as a liquid crystal display substrate.

The invention claimed is:

1. A substrate-placing mechanism to be provided in a processing container of a substrate-processing apparatus comprising:

a stage having: a base body on which a substrate is placed, a heat-generating body for heating the substrate placed on the base body, and a feed terminal part for feeding electric power to the heat-generating body, a hollow supporting part fixed to a base of the processing container for supporting the stage, a connection terminal part fixed to the base of the processing container under the supporting part for being connected to an electric power source located outside the processing container, a feed member connected to the feed terminal part and extending in the hollow supporting part, and a spring member that connects the feed member and the connection terminal part.

2. A substrate-placing mechanism according to claim 1, wherein the spring member connects the feed member and the connection terminal part in such a manner that the feed member keeps being subjected to a tensile force even when the feed member thermally expands during a heat generation of the heat-generating body.

3. A substrate-placing mechanism according to claim 2, wherein the spring member connects the feed member and the connection terminal part at a room temperature under a condition wherein the spring member is extended by a distance larger than a maximum length of thermal expansion of the feed member during the heat generation of the heat-generating body.

4. A substrate-placing mechanism according to claim 1, wherein the feed member comprises a feed rod and a feed wire of a braided structure.

5. A substrate-placing mechanism according to claim 1, wherein the spring member is a plate spring.

6. A substrate-placing mechanism according to claim 5, wherein the plate spring mainly consists of one or more horizontal-plane parts and one or more vertical-plane parts.

7. A substrate-placing mechanism according to claim 1, wherein the base body of the stage is made of a ceramic, and the heat-generating body of the stage is buried in the base body.

8. A substrate-processing apparatus comprising, a processing container in which a reduced pressure can be maintained, a substrate-placing mechanism according to claim 1 provided in the processing container, and a processing mechanism that conducts a predetermined process to a substrate placed on the substrate-placing mechanism.

* * * * *